United States Patent
Chen et al.

(10) Patent No.: US 8,223,479 B2
(45) Date of Patent: Jul. 17, 2012

(54) SERVER ENCLOSURE AND CONNECTION ELEMENT THEREOF

(75) Inventors: Yang-Yuan Chen, Taipei Hsien (TW); Heng-Chen Kuo, Taipei Hsien (TW); Tsung-Hsi Li, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 204 days.

(21) Appl. No.: 12/813,526

(22) Filed: Jun. 11, 2010

(65) Prior Publication Data

US 2011/0292599 A1    Dec. 1, 2011

(30) Foreign Application Priority Data

May 25, 2010    (TW) .............................. 99116735 A

(51) Int. Cl.
G06F 1/16    (2006.01)
(52) U.S. Cl. .................. 361/679.01; 174/250; 439/215; 455/466
(58) Field of Classification Search .................. 174/250, 174/520; 312/223.2, 312, 236, 223.3, 223.5; 345/531, 168, 169; 361/679.39, 679.33, 361/679.32, 679.58, 679.37, 679.46, 679.02, 361/679.5, 679.47, 679.31, 679.49, 679.4, 679.25, 679.21, 752, 753, 690; 455/435.1, 455/458, 424, 466, 419, 161.3, 522, 560; 439/76.1, 65, 215
See application file for complete search history.

(56) References Cited

U.S. PATENT DOCUMENTS

| | | | | |
|---|---|---|---|---|
| 4,547,689 A | * | 10/1985 | Tsuchimoto et al. | ........... 310/71 |
| 5,092,787 A | * | 3/1992 | Wise et al. | .................... 439/215 |
| 2011/0294309 A1 | * | 12/2011 | Chen et al. | ..................... 439/65 |

* cited by examiner

Primary Examiner — Hung Duong
(74) Attorney, Agent, or Firm — Altis Law Group, Inc.

(57) ABSTRACT

A server enclosure includes a power input terminal to receive power signals, a number of connection elements, a number of lead terminals, and a number of power output terminals. Each connection element includes a connection portion and two fixing arms extending from opposite ends of the connection portion. The connection portion is engaged with the power input terminal to receive the power signals and output the power signals to the two fixing arms. Each lead terminal includes a first connection portion fixed to one fixing arm along an extending direction of the fixing arm to receive the power signals and a second connection portion to receive the power signals. Each power output terminal is connected to one of the second connection portions to receive the power signals.

8 Claims, 3 Drawing Sheets

SERVER ENCLOSURE AND CONNECTION ELEMENT THEREOF

BACKGROUND

1. Technical Field

The present disclosure relates to server enclosures and, particularly, to a server enclosure having a connection element.

2. Description of Related Art

In a server power distribution system, several leads are connected to a power input terminal of the server enclosure via lead terminals. However, owing to limited space in the server enclosure, space between the leads and the corresponding side of the server enclosure maybe too small and thus unsafe. Further, connecting leads to a power input terminal of the server enclosure by lead terminals is a waste of space.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
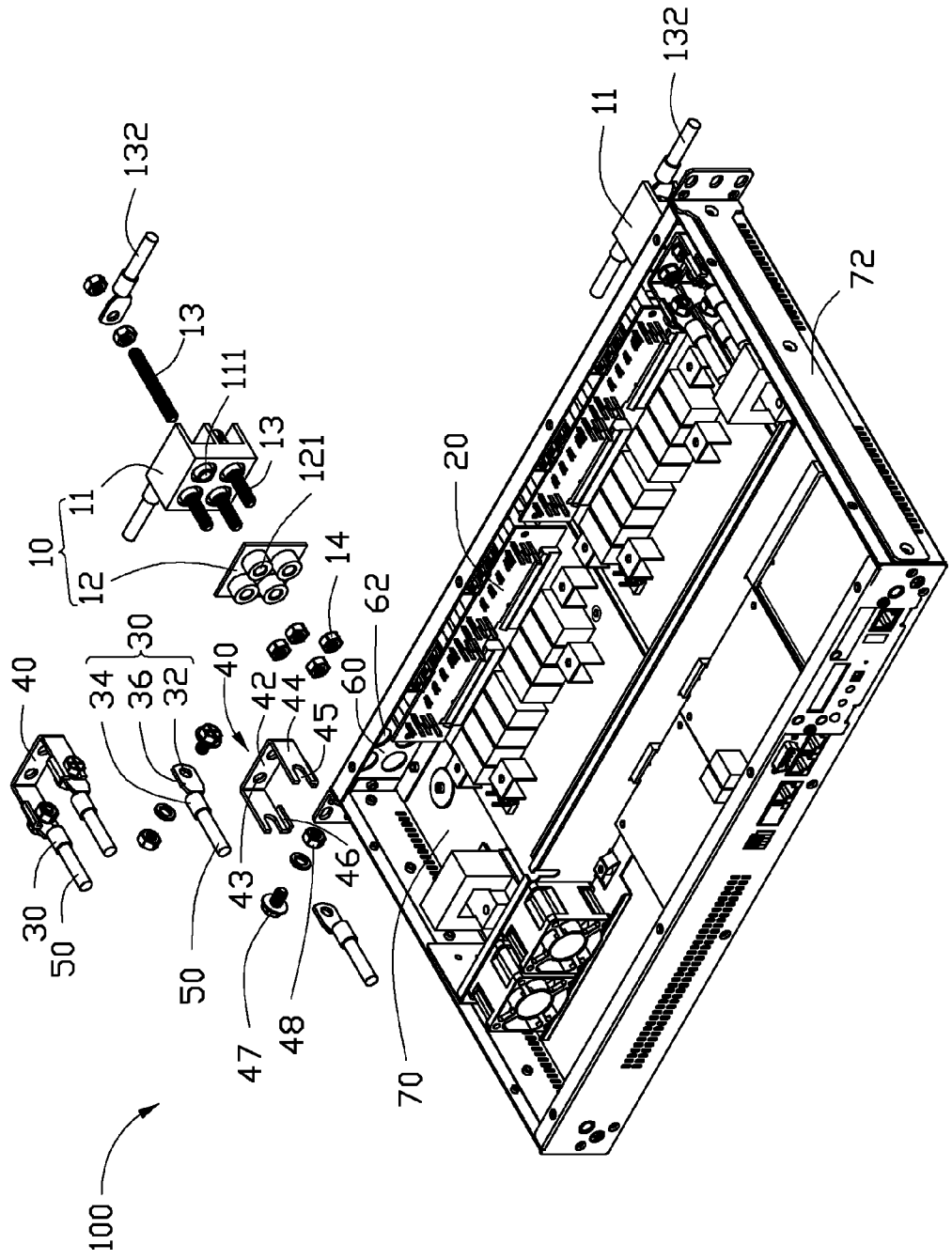
FIG. 1 is an exploded, isometric view of an exemplary embodiment of a server enclosure, the server enclosure including a connection element.

Referring to FIG. 1, an exemplary embodiment of a server enclosure 100 includes two power input terminals 10, some power output terminals 20, eight lead terminals 30, and four connection elements 40. Each power input terminal 10 corresponds to two connection elements 40; each connection element 40 corresponds to two lead terminals 30; and each lead terminal 30 corresponds to one power output terminal 20. The server enclosure 100 includes a bottom board 70, two end boards 72 vertically mounted to opposite ends of the bottom board 70, a back board 60 vertically mounted to a back side of the bottom board 70, and a top board (not shown) opposite to the bottom board. Four first through holes 62 are defined in the back board 60, corresponding to each power input terminal 10.

Each power input terminal 10 includes a power connector 11 and a fixing element 12. Each power connector 11 is used to connect to external leads 132 to receive power signals. Four second through holes 111 corresponding to the four first through holes 62 are defined in each power connector 11. Each fixing element 12 is used to fix a corresponding power connector 11 to the back board 60 of the server enclosure 100. Four third through holes 121 corresponding to the second through holes 111 are defined in each fixing element 12.

Each lead terminal 30 includes a first connection portion 34 and a second connection portion 36 extending from the first connection portion 34. Each first connection portion 34 is connected to a lead 50. A hole 32 is defined in each second connection portion 36. In the embodiment, an angle between the first connection portion 34 and the second connection portion 36 is 180 degrees.

Figure 2:
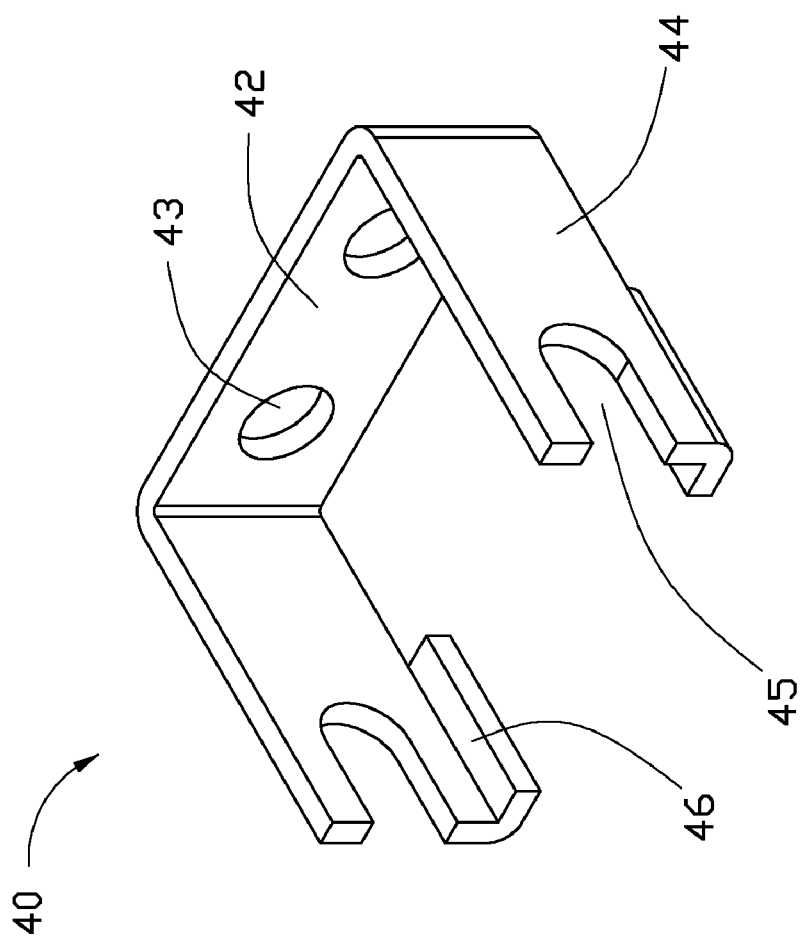
FIG. 2 is an enlarged view of the connection element of FIG. 1.

Referring to FIG. 2, the two connection elements 40 are generally U-shaped electrical conductors. Each connection element 40 includes a connection portion 42 and two fixing arms 44 perpendicularly extending from opposite ends of the connection portion 42. Two holes 43 are defined in the connection portion 42. A stopping portion 46 perpendicularly extends from a bottom or a top of a distal end of each fixing arm 44 towards the other fixing arm 44. A U-shaped opening 45 is defined in the distal end of each fixing arm 44.

Figure 3:
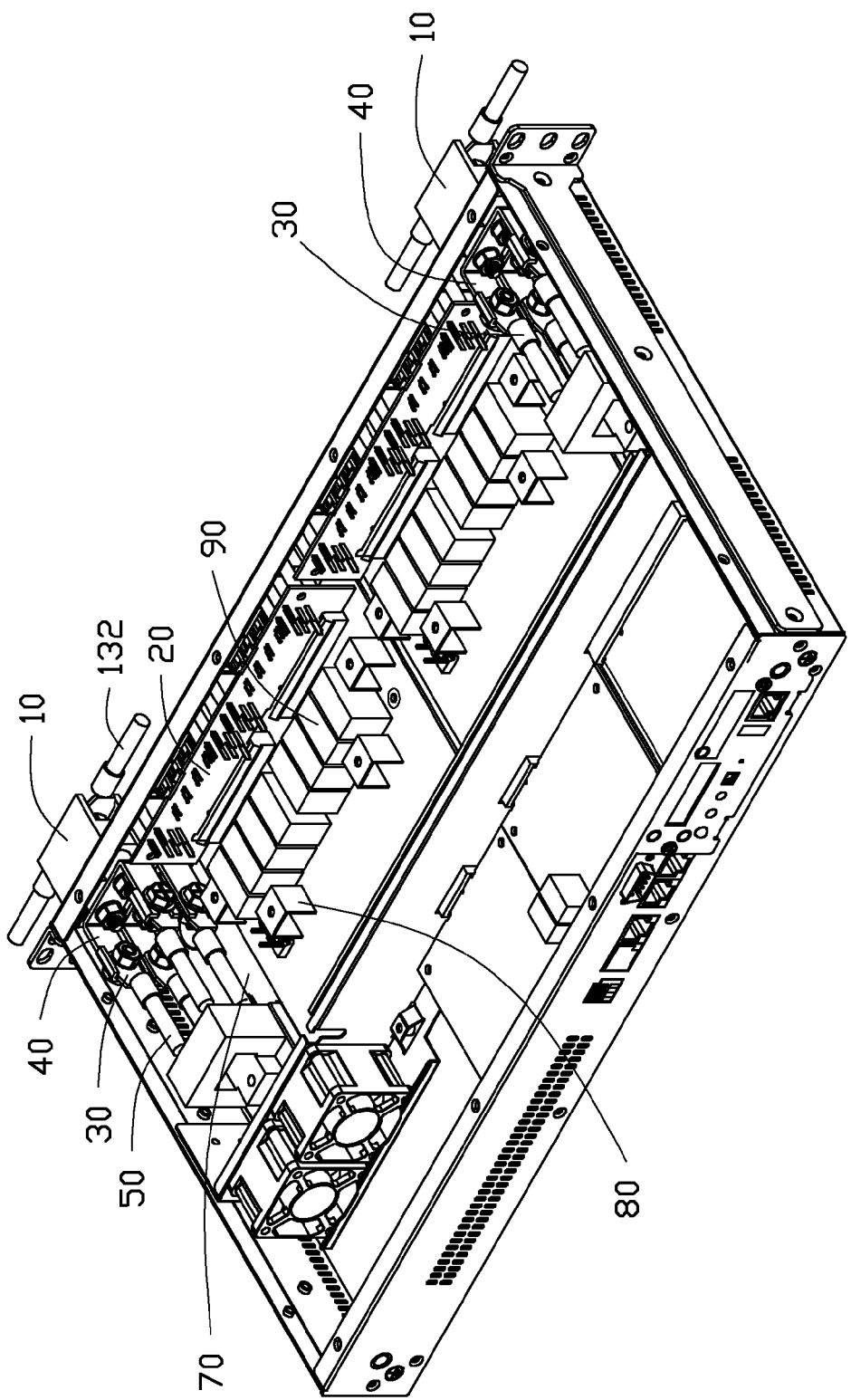
FIG. 3 is an assembled view of the server enclosure of FIG. 1.

Referring to FIG. 3, in assembly, each lead terminal 30 is fixed to an inner side of one fixing arm 44 by a screw 47 extending through the opening 45 of the fixing arm 44 and the hole 32 of the lead terminal 30, to engage with a corresponding screw nut 48. The power connector 11 and the fixing element 12 are respectively mounted to an outer side and an inner side of the back board 60 by four screws 13 extending through the four second through holes 111 of the power connector 11, the four first through holes 62 of the back board 60, and the four third through holes 121 of the fixing element 12. Two connection elements 40 are fixed to a corresponding fixing element 12 by the screws 13 further extending through the holes 43 of the corresponding connection portions 42 to engage with four screw nuts 14, respectively. The stopping portions 46 at the bottoms of the connection elements 40 are close to the bottom board 70 of the server enclosure 100; the stopping portions 46 at the tops of the connection elements 40 are closed to the top board of the server enclosure 100, to prevent the lead terminals 30 from swinging upwards or downwards to touch the bottom board 70 and top board of the server enclosure 100. Ends of the four screws 13 exposed to the outside of the server enclosure 100 are connected to the external leads 132. When each power input terminal 10 receives the power signals, the power signals are output to the corresponding connection elements 40 via the power input terminal 10, and then the power signals are output to the corresponding power output terminal 20 via the corresponding lead terminals 30, corresponding electric terminals 80 connected to the lead terminals 30, and corresponding relays 90 in the server enclosure 100.

In other embodiments, a protrusion can be formed on each fixing arm 44 to engage with the hole 32 of each lead terminal 30, to fix the lead terminal 30 to the fixing arm 44. The numbers of the power input terminal 10, the power output terminal 20, the connection element 40 can be adjusted according to need. Two lead terminals 30 can be fixed to one fixing arm 44, that is, the two lead terminals 30 are fixed to an inner side and an outside of one fixing arm 44.

In the server enclosure 100, the lead terminals 30 connected to the leads 50 are fixed to the inner side of the fixing arms 44, which ensures there is a safe space between the leads 50 and the corresponding side board 72 of the server enclosure 100 yet still conserve the space of the server enclosure 100.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A server enclosure comprising:
   a power input terminal to receive power signals;
   a plurality of connection element each comprising a connection portion connected to the power input terminal to receive the power signals and two fixing arms extending from opposite ends of the connection portion to output the power signals;
   a plurality of lead terminals each comprising a first connection portion fixed to one fixing arm of one of the plurality of connection elements along an extending direction of the fixing arm to receive the power signals, and a second connection portion to output the power signals; and
   a plurality of power output terminals each electrically connected to one of the plurality of second connection portions to receive the power signals.

2. The server enclosure of claim 1, wherein two first holes are defined in each connection portion, allowing two screws to extend through the two first holes to engage the connection portion with the power input terminal.

3. The server enclosure of claim 2, wherein a second hole is defined in the first connection portion of each lead terminal, an opening corresponding to the second hole is defined in each fixing arm to allow a screw to extend through the second hole of each first connection portion and the opening of each fixing arm, to fix each lead terminal to one fixing arm.

4. The server enclosure of claim 1, wherein two stopping portions extend towards each other from bottoms or tops of distal ends of the two fixing arms.

5. A connection element to fix a plurality of lead terminals that are connected to a plurality of power output terminals to a power input terminal of a server enclosure, the connection element comprising:
   a connection portion to engage with the power input terminal to receive power signals from the power input terminal; and
   two fixing arms extending from opposite ends of the connection portion, wherein each fixing arm is used to fix one lead terminal along an extending direction of the fixing arm to output the power signals to the power output terminal.

6. The connection element of claim 5, wherein two first holes are defined in the connection portion, allowing two screws to extend through the two first hole to engage with the power input terminal.

7. The connection element of claim 6, wherein an opening is defined in each fixing arm, to allow a screw to extend through the opening to engage with the corresponding lead terminal.

8. The connection element of claim 5, wherein two stopping portions extend towards each other from bottoms or tops of distal ends of the two fixing arms.

* * * * *